United States Patent [19]
Shimoji et al.

[11] Patent Number: 5,502,668
[45] Date of Patent: Mar. 26, 1996

[54] SEMICONDUCTOR MEMORY DEVICE CAPABLE OF LOW-VOLTAGE PROGRAMMING

[75] Inventors: Noriyuki Shimoji; Hidemi Takasu, both of Kyoto, Japan

[73] Assignee: Rohm Co., Ltd., Kyoto, Japan

[21] Appl. No.: 201,730

[22] Filed: Feb. 25, 1994

Related U.S. Application Data

[63] Continuation of Ser. No. 924,843, Aug. 4, 1992, abandoned.

[30] Foreign Application Priority Data

Aug. 16, 1991 [JP] Japan .................................. 3-205872
Aug. 16, 1991 [JP] Japan .................................. 3-205873

[51] Int. Cl.$^6$ ..................................................... H01L 29/68
[52] U.S. Cl. .................... 365/185.28; 365/104; 257/317; 257/321
[58] Field of Search ..................................... 365/185, 104, 365/163; 257/317, 321, 318

[56] References Cited

U.S. PATENT DOCUMENTS 5,017,979  5/1991  Fujii et al. .............................. 257/319
5,063,423  11/1991  Fujii et al. .......................... 365/104 X Primary Examiner—Do Hyun Yoo
Attorney, Agent, or Firm—Brumbaugh, Graves, Donohue & Raymond

[57] ABSTRACT

A poly-silicon or amorphous silicon plate having cone-like protrusions is provided on a Si substrate in a tunnel window area such that the edges of the protrusions are placed very close to a floating gate. Alternatively, the top surface of a Si substrate is shaped into protrusions.

9 Claims, 2 Drawing Sheets

5,502,668

SEMICONDUCTOR MEMORY DEVICE CAPABLE OF LOW-VOLTAGE PROGRAMMING

This application is a continuation of application Ser. No. 07/924,843, filed on Aug. 4, 1992, now abandoned.

BACKGROUND OF THE INVENTION

The present invention relates to a semiconductor memory device and, more specifically, to an EEPROM and EPROM having a floating gate in which the data writing and erasing operations can be performed at a lower voltage than conventional ones.

In most basic floating-gate-type EEPROMs, electrons are controlled to move between the floating gate and the diffusion region on the data line side through the tunnel window provided therebetween. Usually, a tunnel oxide film of the tunnel window is formed with a uniform thickness, and so electrons flow uniformly in the tunnel window plane.

In order to improve the efficiency of injecting electrons into and removing those from the floating gate, there have been proposed some techniques which utilize a poly-silicon surface that is formed into an asperity to enhance an electric field acting on electrons. More specifically, in such techniques, an asperity is provided on the floating gate surface and a charge is taken out to flow into a separate poly-silicon lead, or an injection lead having an asperity is formed under the floating gate and electrons are injected through the injection lead.

In practice, however, the above techniques are associated with the following problems. To inject electrons into the floating gate in the most basic device described above, it is usually required that a high voltage of more than 20 V be applied to the control gate, which necessitates a complex device structure and a large device area. Further, the devices utilizing the poly-silicon asperity still have various problems, for instance, increased wiring which results in complex circuitry and an increased device area.

SUMMARY OF THE INVENTION

In order to solve the above-described problems, the present invention has an object of realizing low-voltage programming in a semiconductor memory device of the above kind, thereby reducing the size of a memory cell, simplifying peripheral circuits, and improving the device reliability.

According to a first aspect of the invention, an FET memory comprises:

a semiconductor substrate;

a floating gate;

a tunnel window provided between the floating gate and a diffusion region of the semiconductor substrate on a data line side; and a silicon plate having an asperity and provided on the semiconductor substrate in an area of the tunnel window, the asperity being placed close to the floating gate.

According to a second aspect of the invention, an FET memory comprises:

a semiconductor substrate;

a floating gate;

a tunnel window provided between the floating gate and a diffusion region of the semiconductor substrate on a data line side; and a surface of the semiconductor substrate being formed into an asperity, the asperity being placed close to the floating gate in an area of the tunnel window.

DESCRIPTION OF THE PREFERRED EMBODIMENTS

A semiconductor memory device according to a first embodiment of the present invention is described hereinafter with reference to FIGS. 1–3.

Figure 1:
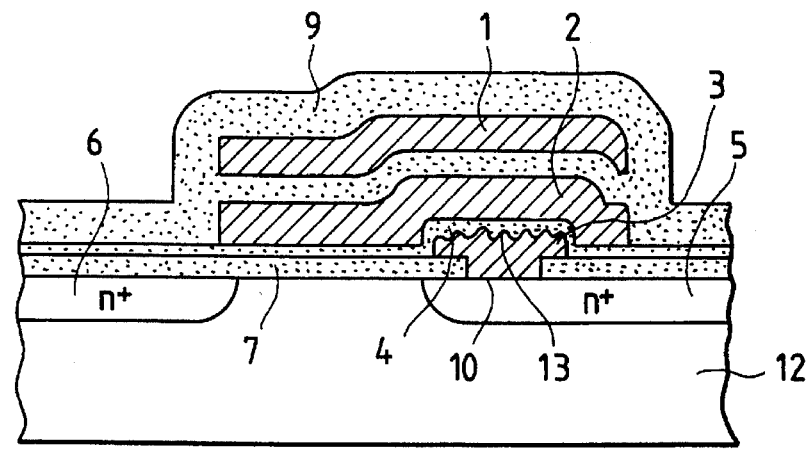
FIG. 1 is a sectional view of an EEPROM according to a first embodiment of the present invention.
Figure 2:
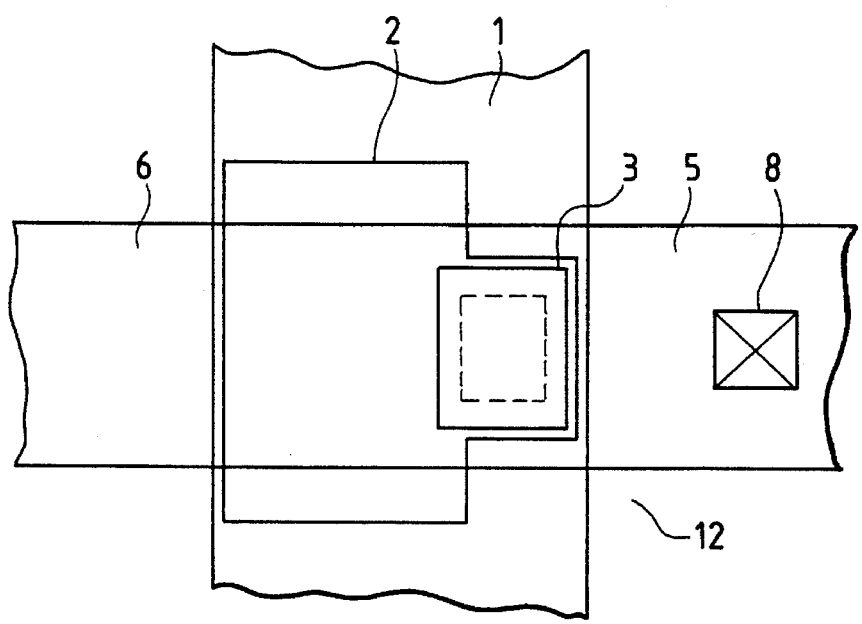
FIG. 2 is a top view of FIG. 1.
Figure 3:
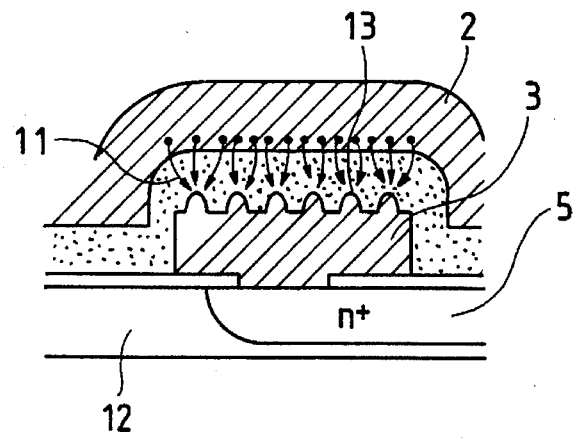
FIG. 3 is an enlarged view of a part of FIG. 1.

FIGS. 1–3 show a configuration of an EEPROM having a floating gate according to the first embodiment. Reference numeral 12 represents a Si substrate; 1, a control gate; 2, a floating gate; 10, a tunnel window; 4, a tunnel oxide film; 5, a drain diffusion region; and 6, a source diffusion region. A poly-silicon or amorphous silicon plate 3 as an injector is disposed on the Si substrate 12 so as to be opposed to the tunnel window 10. The top surface of the silicon plate 3 is shaped so as to assume at least one cone-like or truncated-cone-like protrusion 13, and the top of the protrusion 13 is placed very close to the floating gate 2. Further, reference numeral 8 represents a bit contact; 9, an interlayer film; and 11, electric lines of force that are drawn to illustrate the operation of the EEPROM.

Since the silicon plate 3 is composed of poly-silicon or amorphous silicon, an asperity can easily be formed during its deposition or in a subsequent heat treatment process. The silicon plate 3 is directly attached to the top surface of the Si substrate 12 in the tunnel window area, so that the electric lines of force 11, that are generated in the tunnel oxide film 4 during the programming operation, are concentrated on the protrusions 13.

In the EEPROM having the above structure, at the time of the data writing operation, the drain diffusion region 5 is grounded and a positive high voltage is applied to the control gate 1, so that electrons are injected from the silicon plate 3 to the floating gate 2 through the tunnel oxide film 4. At the time of the erasing operation, a high voltage is applied to the drain diffusion region 5 and the control gate 1 is grounded, which is opposite to the case of the writing operation, so that electrons escape from the floating gate 2. The silicon plate 3 is provided to cover the tunnel window 10 that is formed by removing a part of a gate oxide film 7 by wet-etching.

In the writing or erasing operation, a voltage difference occurs between the silicon plate 3 and the floating gate 2 that is in capacitance coupling with the control gate 1, and the electric lines of force 11 originating from the floating gate 2 are concentrated on the protrusions 13 of the silicon plate 3 to locally enhance the electric field strength. This allows the tunneling of electrons at a lower voltage, thereby enabling low-voltage programming.

A semiconductor memory device according to a second embodiment is described hereinafter with reference to FIGS. 4–6.

Figure 4:
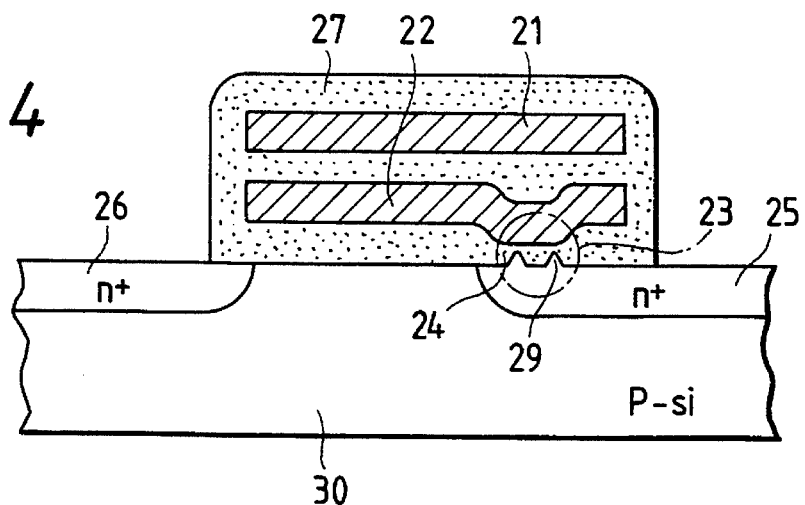
FIG. 4 is a sectional view of an EEPROM according to a second embodiment of the invention.
Figure 5:
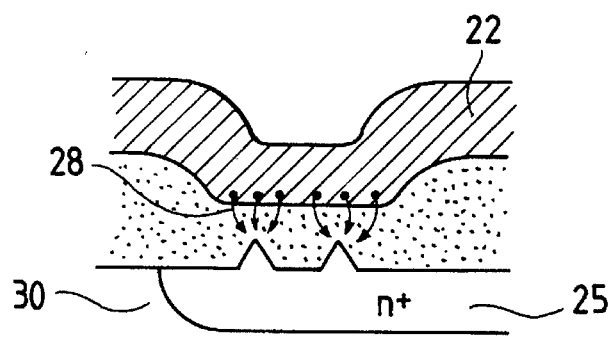
FIG. 5 is an enlarged view of a part of FIG. 4.
Figure 6:
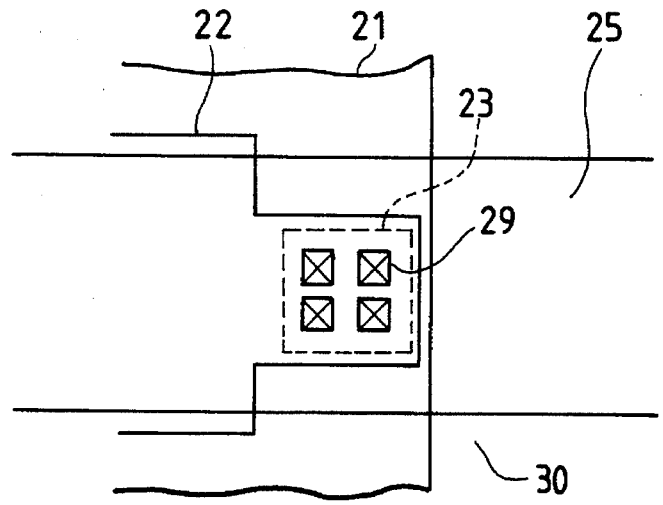
FIG. 6 is a top view of FIG. 4.

FIGS. 4–6 show a configuration of an EEPROM having a floating gate according to the second embodiment. Reference numeral 30 represents a Si substrate; 21, a control gate; 22, a floating gate; 23, a tunnel window; 24, a tunnel oxide film; 25, a drain diffusion region; and 26, a source diffusion region. The top surface of the Si substrate 30 is shaped by etching to produce at least one cone-like or truncated-cone-like protrusion 29 in an area opposed to the tunnel window 23, and the top of the protrusion 29 is placed very close to the floating gate 22.

In the EEPROM having the above structure, at the time of the data writing operation, the drain diffusion region 25 is grounded and a positive high voltage is applied to the control gate 21, so that electrons are injected from the protrusions 29 (that are formed in the tunnel window area) of the Si substrate 30 to the floating gate 22 through the tunnel oxide film 24. At the time of the erasing operation, a high voltage is applied to the drain diffusion region 25 and the control gate 21 is grounded, which is opposite to the case of the writing operation, so that electrons escape from the floating gate 22. The top surface of the Si substrate 30 is shaped into the protrusions 29, for instance, using an etchant, such as KOH, that anisotropically etches silicon.

In the writing or erasing operation, a voltage difference occurs between the protrusions 29 and the floating gate 22 that is in capacitance coupling with the control gate 21, and electric lines of force 28 originating from the floating gate 22 are concentrated on the protrusions 29 of an injector to locally enhance the electric field strength. This allows the tunneling of electrons at a lower voltage, thereby enabling low-voltage programming.

According to the invention, the silicon plate having the asperity is provided on the Si substrate, or the top surface of the Si substrate is shaped into the protrusions. As a result, in the programming operation, the electric field in the tunnel oxide film is concentrated on the edges of the protrusions, that is, the electric field strength is enhanced in the vicinity of the protrusions, thereby facilitating the tunneling of electrons near the protrusions. Thus, the low-voltage programming is realized.

Therefore, in the semiconductor memory device of the invention, following advantages are obtained with a simple device structure as described above: the size of the memory cell can be reduced (a large memory cell is conventionally required because of the necessity of high voltage application in the programming operation); peripheral circuits can be simplified; and the device reliability can be improved.

On the other hand, according to the invention, the tunnel oxide film can be made thicker than the conventional devices while the same writing and erasing efficiency as the conventional devices is assured. Therefore, the device having the thicker tunnel oxide film can provide the following advantages: a manufacturing margin is increased; a highly reliable oxide film can be formed; and the capacitance of the tunnel window portion can be reduced, which makes it possible to increase a voltage developing across the tunnel oxide film.

What is claimed is:

1. An FET memory comprising:

a silicon substrate;

a floating gate;

a tunnel insulating layer provided between the floating gate and a diffusion region of the silicon substrate on a data line side; and a silicon plate provided on the silicon substrate and having a plurality of adjacent asperities extending into the tunnel insulating layer to produce a localized increase in electric field strength within the tunnel insulating layer, the asperities being placed close to the floating gate to enhance electron injection into the floating gate.

2. The FET memory of claim 1, wherein the silicon plate is made of poly-silicon.

3. The FET memory of claim 1, wherein the silicon plate is made of amorphous silicon.

4. The FET memory of claim 1, wherein each asperity includes at least one protrusion.

5. The FET memory of claim 1, wherein the silicon plate is disposed in a window formed by removing a part of a gate oxide film formed on the silicon substrate.

6. The FET memory of claim 1, wherein the FET memory is an electrically erasable programmable ROM.

7. An FET memory comprising:

a silicon substrate;

a floating gate;

an insulating layer having a tunnel window provided between the floating gate and a diffusion region of the silicon substrate on a data line side; and a surface of the silicon substrate in the diffusion region being formed with a plurality of adjacent asperities to produce a localized increase in electric field strength within the tunnel window, the asperities being placed close to the floating gate and extending into the tunnel window to enhance electron injection into the floating gate.

8. The FET memory of claim 7, wherein each asperity includes at least one protrusion.

9. The FET memory of claim 7, wherein the FET memory is an electrically erasable programmable ROM.

* * * * *